(12) United States Patent
Van Der Ploeg

(10) Patent No.: US 7,330,145 B2
(45) Date of Patent: Feb. 12, 2008

(54) DUAL RESIDUE PIPELINED ANALOG-TO-DIGITAL CONVERTER

(75) Inventor: Hendrik Van Der Ploeg, Eindhoven (NL)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 10/576,555

(22) PCT Filed: Oct. 18, 2004

(86) PCT No.: PCT/IB2004/052129

§ 371 (c)(1),
(2), (4) Date: Apr. 19, 2006

(87) PCT Pub. No.: WO2005/041418

PCT Pub. Date: May 6, 2005

(65) Prior Publication Data

US 2007/0132629 A1    Jun. 14, 2007

(30) Foreign Application Priority Data

Oct. 23, 2003  (EP)  ................................. 03103935

(51) Int. Cl.
    H03M 1/38    (2006.01)
(52) U.S. Cl. .................. 341/161; 341/118; 341/155; 341/162; 341/163; 341/172
(58) Field of Classification Search ................ 341/161
    See application file for complete search history.

(56) References Cited

U.S. PATENT DOCUMENTS

| 5,387,914 | A | * | 2/1995 | Mangelsdorf | ............... 341/156 |
| 5,739,781 | A | | 4/1998 | Kagey | |
| 6,028,546 | A | * | 2/2000 | Signell et al. | ............... 341/161 |
| 6,031,480 | A | * | 2/2000 | Soenen et al. | ............... 341/161 |
| 6,097,326 | A | * | 8/2000 | Opris et al. | .................. 341/161 |
| 6,169,502 | B1 | * | 1/2001 | Johnson et al. | ............. 341/120 |
| 6,337,651 | B1 | * | 1/2002 | Chiang | ........................ 341/161 |
| 6,366,230 | B1 | * | 4/2002 | Zhang et al. | ............... 341/162 |
| 6,486,820 | B1 | | 11/2002 | Allworth et al. | |
| 6,600,440 | B1 | * | 7/2003 | Sakurai | ....................... 341/172 |
| 7,129,881 | B2 | * | 10/2006 | Franz | ......................... 341/161 |

OTHER PUBLICATIONS

Thomas B. Cho: "A 10 b, 20 MSample/s, 35 MW Pipeline A/D Converter." IEEE Journal of Solid-State Circuits; vol. 30, No. 3; Mar. 1995; pp. 166-172.

Opris Ion E. et al: "A Single-Ended 12-Bit . . . "; IEEE Journal of Solid-State Circuits; vol. 33, No. 12; Dec. 1998, pp. 1893-1903.

(Continued)

Primary Examiner—Khai M. Nguyen
(74) Attorney, Agent, or Firm—Peter Zawilski

(57) ABSTRACT

Consistent with an example embodiment, there is dual residue pipelined AD converter comprising a cascade of, preferably balanced, switched capacitor dual residue converter stages for producing from first and second residue input signals one or more digital bits and first and second residue output signals for application to the next stage in the cascade. Preferably the first and second residue input signals charge input capacitors whose charge is subsequently transferred to output capacitors by means of operational amplifiers. The switched capacitor architecture allows compensating for DC-offset voltages of the operational amplifiers. The switched capacitor architecture also allows the implementation of 1.5 bit converter stages.

14 Claims, 8 Drawing Sheets

OTHER PUBLICATIONS

Figure 1:
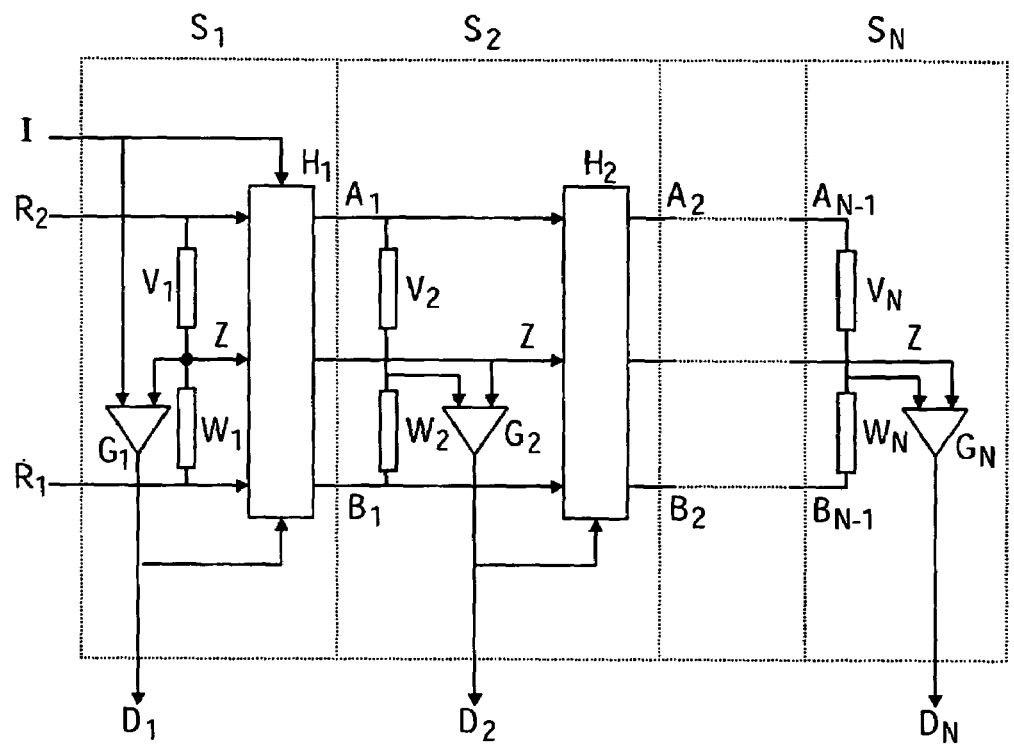

Ingino Joseph et al. : "A Continously Calibrated 12-B . . . " IEEE Journal of Solid-State Circuits; vol. 33, No. 12, Dec. 1998; pp. 1920-1931.

Yang Wenhua et al: "A 3-V 340-MW 14-B 75-MSample/s . . . "; IEEE Journal of Solid State Circuits; vol. 36; No. 12; Dec. 2001; pp. 1931-1936.

Yu Paul et al.: A 14b 40MSample/s Piplined . . . ISSCC 2001 / Session 8 / NYQUIST ADCS / 8.6; IEEE International Solid State Circuits Conference; 2001; Dallas TX; pp. 136-137, 439-440.

Mangelsdorf Chris et al. : "A Two Residue Architecture . . . ", ISSCC 93 / Session 4 / Data Conversion / Paper WP 4.4; IEEE International Solid-State Circuits Conference; pp. 64-65 Feb. 24, 1993.

\* cited by examiner

DUAL RESIDUE PIPELINED ANALOG-TO-DIGITAL CONVERTER

This application is a 371 of PCT/IB04/52129, which has an international filing date of Oct. 18, 2004, designating the United States of America, and claims the benefit of European patent application 03103935.7 filed Oct. 23, 2003.

The invention relates to a dual residue pipelined AD-converter for converting an analog input signal to a digital output signal, said converter comprising a cascade of dual residue converter stages, the first of said stages comprising means to receive the analog input signal, means to derive one or more digital bits from said analog input signal and means to generate first and second residue signals representing the quantization error left after the AD-conversion of said first stage, each of the following stages in the cascade of dual residue converter stages comprising means to receive the first and second residue signals generated by the previous stage in the cascade, means to derive one or more further digital bits from said received first and second residue signals and each of said following stages except the last one in the cascade comprising means to generate first and second residue signals representing the quantization error left after the AD-conversion of the stage. Such dual residue pipelined AD converter is known from the paper "A Two Residue Architecture for Multistage ADC's" by Mangelsdorf et al, 1993 IEEE International Solid State Circuits Conference, Feb. 24, 1993.

A single residue pipelined AD converter comprises a plurality of cascaded stages of which each stage calculates only a part (k) of the bits of the desired total digital word. To this end the stage contains a k-bit AD converter that compares the analog input with at least one reference voltage and that outputs a k-bit digital signal resulting from this comparison. Subsequently a residue signal is derived. This derivation may be considered as applying the k-bit digital output of the AD converter to a DAC that delivers the analog representation of this k-bit signal and generating the difference between the analog input and the analog representation of the k-bit signal. This difference is the quantization error or residue that is applied to the next stage of the cascade for deriving the next bit(s) of the digital word. A major drawback of such single residue pipelined AD converter is that the residue signal, prior to being applied to the next stage of the cascade, has to be amplified with a factor that is very closely equal to $2^k$. This not only in order to optimally use the dynamic range of the next stage but, more importantly, to be able to use the derived reference voltage(s) for the digitization of the residue signal in all the stages of the cascade.

This problem can be solved when not only the residue is amplified but with the same amplification factor also the reference level(s), see e.g. U.S. Pat. No. 5,739,781. The result is that the value of the gain factor is not anymore critical, because now the only task of the interstage amplification is to accommodate the residue signal to the dynamic range of the next stage in the pipeline. Equivalent to amplifying the reference level(s) simultaneously with the residue signal is to process and amplify two residue signals. One of these residue signals represents the distance between the analog input signal and the nearest reference level below the input signal and the other residue signal represents the distance between the analog input signal and the nearest reference level above the input signal. Such AD-converter is known as "dual-residue pipelined AD converter".

The prior art dual residue pipelined AD converters normally operate with resistive dividers. The present invention provides a dual residue pipelined AD converter that has the advantages of the prior art converters and that operates at reduced power and the dual residue pipelined AD converter according to the present invention is therefore characterized in that each of the stages of the dual residue pipelined AD-converter, except the last one, comprises switched capacitor means for the generation of the first and second residue signals.

It may be observed that the use of switched capacitors in single residue pipelined AD converters is per se well known in the art. In these prior art converters the interstage gain should ideally be exactly equal to 2 in order to have no linearity problems. In these converters the interstage gain is determined by capacitor ratios of different capacitors and therefore dependent on the parasitic capacitances of the operational amplifiers that are used as amplifying elements in the stages. In practice the problem of the insufficiently accurate interstage amplification factor is attacked in various ways. One way is to calibrate the errors and to use the result of the calibration to correct the effect of the errors. E.g. in "IEEE Journal of Solid State Circuits, Vol. 33, No 12, December 1998, pp. 1898-1903" it is proposed to calibrate capacitor mismatches and errors due to finite opamp-gain by calibration during an initial power up cycle and then the correction is done in a dual digital pipeline that works synchronously with the analog pipeline. In "IEEE Journal of Solid State Circuits, Vol. 33, No 12, December 1998, pp. 1920-1931" the pipeline stages are successively replaced by a pre-corrected extra stage, then corrected and then replaced to their original position. In "2001 International Solid State Circuits Conference/Session 8, Digest of Technical Papers, pp. 136-137, 439-440" the capacitors of the stages are shuffled to minimize the errors by averaging. In "IEEE Journal of Solid State Circuits, Vol. 36, No 12, December 2001, pp. 1931-1936" it is proposed to use more sophisticated technology, such as double poly, to increase the accurateness of the components. Obviously this latter solution makes the converter more expensive and is especially not appropriate when the converter should be part of a large-scale integrated circuit that is usually implemented with standard process technology.

In a pipelined AD converter according to the invention the linearity of the converter is no longer determined by the ratio between input and output capacitors, i.e. the ratio of dissimilar capacitors, but solely by the matching of the gain factors within one stage i.e. by the matching of similar capacitors within the stage. This requirement is usually reasonably easy to meet in monolithic integrated circuit technology, without the need of calibration or the use of a more expensive IC-process technology.

In switched capacitor architectures one or more capacitors may be connected to an input terminal during a first clock phase and subsequently these capacitors may be switched to an output terminal during a second clock phase. In a dual residue generator according to the invention it is not anymore critical for the gain of the residue signals to be exactly equal to 2 but it is of importance that the gain of the two residue signals is mutually equal. In order to facilitate this mutual gain equality the AD converter according to the invention is further characterized in that each of said following stages except the last one comprise input capacitors for receiving during a sampling phase the first and second residue signals generated by the previous stage, switching means to transfer during a tracking phase the charge of said input capacitors to first and second output capacitors, and means to generate first and second residue signals from said first and second output capacitors respectively.

The pipelined AD-converter of the present invention may be still further characterized in that said switching means are arranged to transfer charge from said first received residue signal to said first output capacitor with a gain factor of approximately 2 and charge from both said first and second received residue signals to said second output capacitor each with a gain factor of approximately 1 in a first sub-range mode and to transfer charge from said second received residue signal to said second output capacitor with a gain factor of approximately 2 and charge from both said first and second received residue signals to said first output capacitor each with a gain factor of approximately 1 in a second sub-range mode. With this arrangement a simple and reliable circuit is provided for assembling each of the two output residue signals from both the two input residue signals.

As mentioned earlier, each of the stages in the cascade comprises comparator means to derive one or more bits that serve to construct the digital output word of the AD-converter. The decision point of the comparator is very critical especially in the earlier stages of the cascade and/or when the AD-converter has to generate a high precision digital output signal of e.g. 12 bit or more. Such decision point may easily be corrupted by imperfections such as offsets in the comparator. In order to prevent such corruption of the comparator output it has already been proposed to use so-called 1.5 bit converter stages, in which the critical decision point is effectively replaced by a third sub-range between and partly overlapping the original sub-ranges. It is another object of the present invention to provide a switched capacitor implementation of such 1.5 bit converter stage and the AD converter according to the invention may therefore be further characterized in that said switching means are additionally arranged to transfer charge from both said first and second received residue signals to said first output capacitor with a gain factor of approximately 3/2 and 1/2 respectively and charge from both said first and second received residue signals to said second output capacitor with a gain factor of approximately 1/2 and 3/2 respectively in a third sub-range mode which lies symmetrically between said first and second sub-range modes.

It is a further aspect of the invention that for the generation of each residue signal an operational amplifier is provided and that each output capacitor is connected during the tracking phase between an output terminal and the inverting input terminal of said operational amplifier. With such arrangement a high speed AD converter can be made because simultaneously with the tracking phase of all even stages the sampling stage of all odd stages can take place. The operational amplifier supplies the energy not only for transferring the charge from the input capacitors to the output capacitors of one stage but also to simultaneously charge the input capacitor(s) of the next stage. Normally a drawback of using operational amplifiers in pipelined AD-converters is that it asks a relatively long period of time for the operational amplifier to fully settle and complete the charge transfer from the input capacitor(s) to the output capacitor. This limits the conversion speed of the converter. However, in dual residue switched capacitor converters according to the present invention it is not necessary for the converter stages to reach their full gain and therefore it is not necessary for the output capacitors to become fully charged, provided that the incomplete charge is similar for the output capacitors of both residue signals. This gives the possibility to increase the conversion speed without risking substantial loss of conversion-linearity.

A drawback of using operational amplifiers for the transfer of charge between input and output capacitors is the DC-offset that often occurs in the operational amplifiers, especially because in practice it is impossible to make the DC-offsets for the various opamp inputs equal to each other. It is a further object of the invention to compensate the offset-voltages of the operational amplifiers and the AD-converter in accordance with the invention may therefore be characterized in that one side of each input capacitor is connected to said inverting input terminal both during the sampling phase and during the tracking phase and that each output capacitor is charged during the sampling phase by the offset voltage at the inverting input of the operational amplifier.

The dual residue pipelined AD-converter according to the invention may also be characterized in that the switched capacitor means are arranged to receive balanced first and second residue signals and to generate there from balanced first and second residue signals for application to the next stage in the cascade. A balanced dual residue converter stage requires balanced operational amplifiers and twice as much capacitors and switches as the unbalanced version. But it allows a twice as large input signal swing and its operation is affected to a lesser extend by substrate-disturbances and even harmonic distortion.

Figure 5:
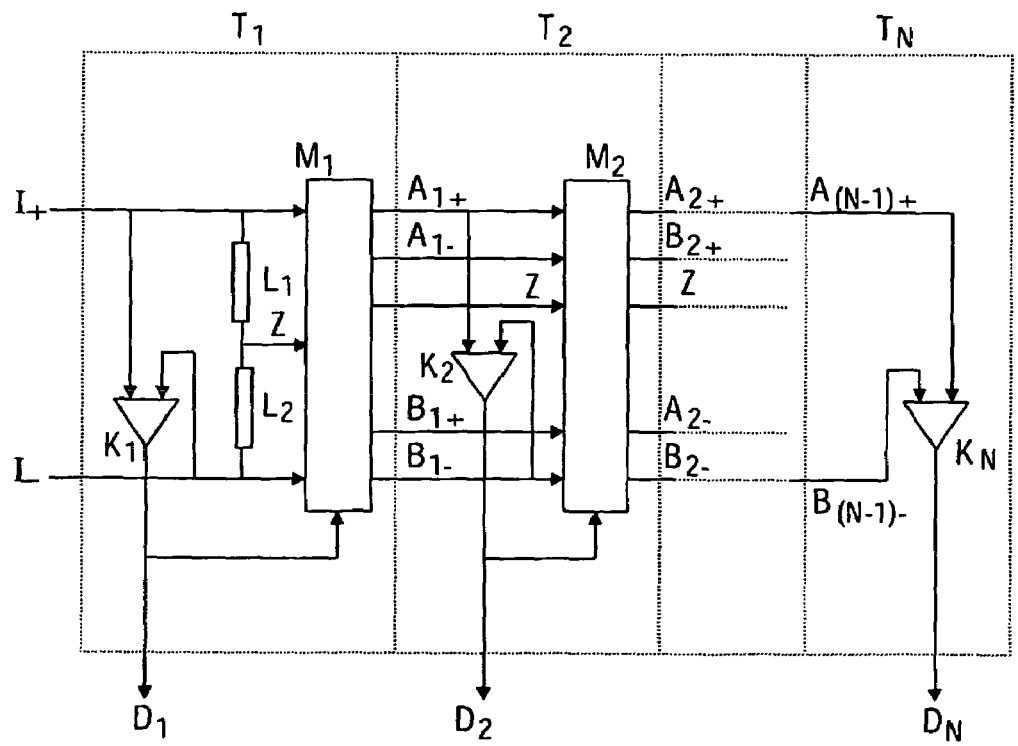
Figure 2:
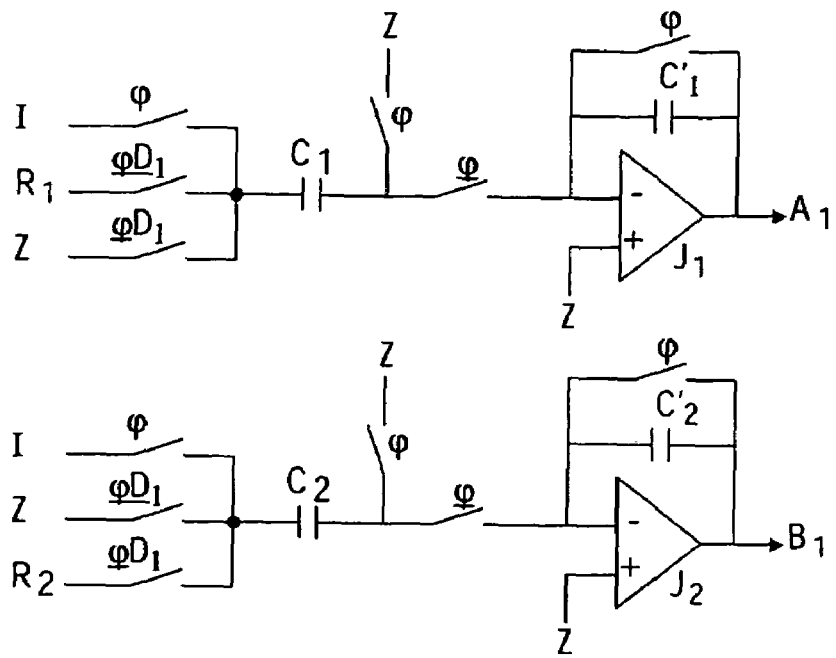
Figure 3:
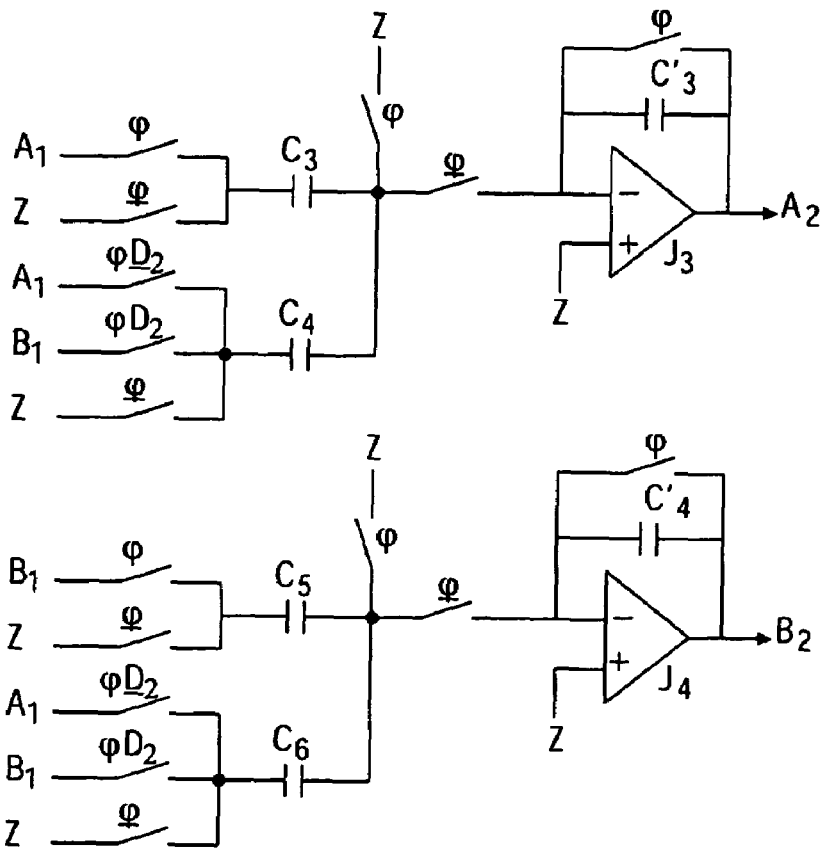
Figure 6:
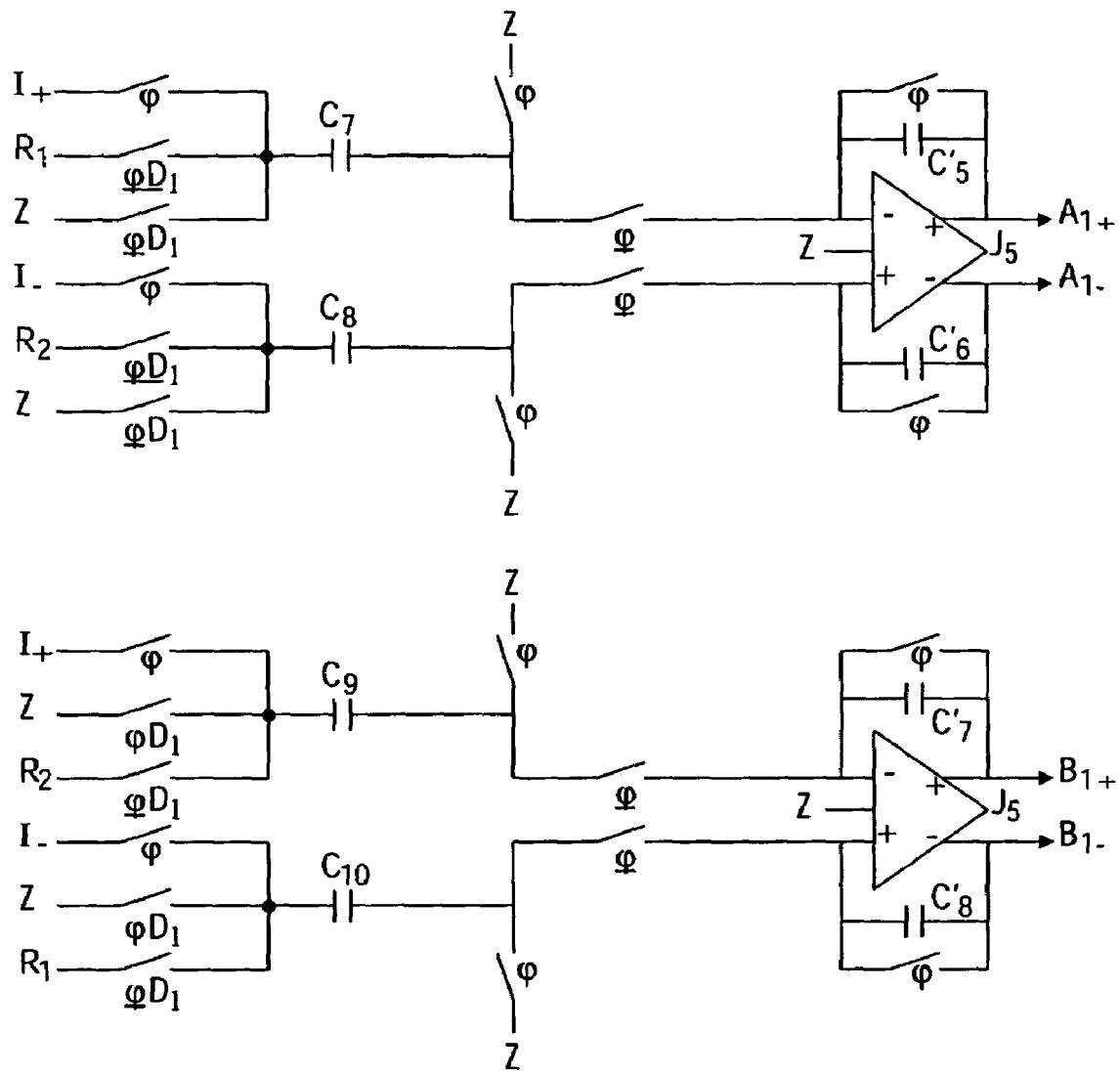
Figure 7:
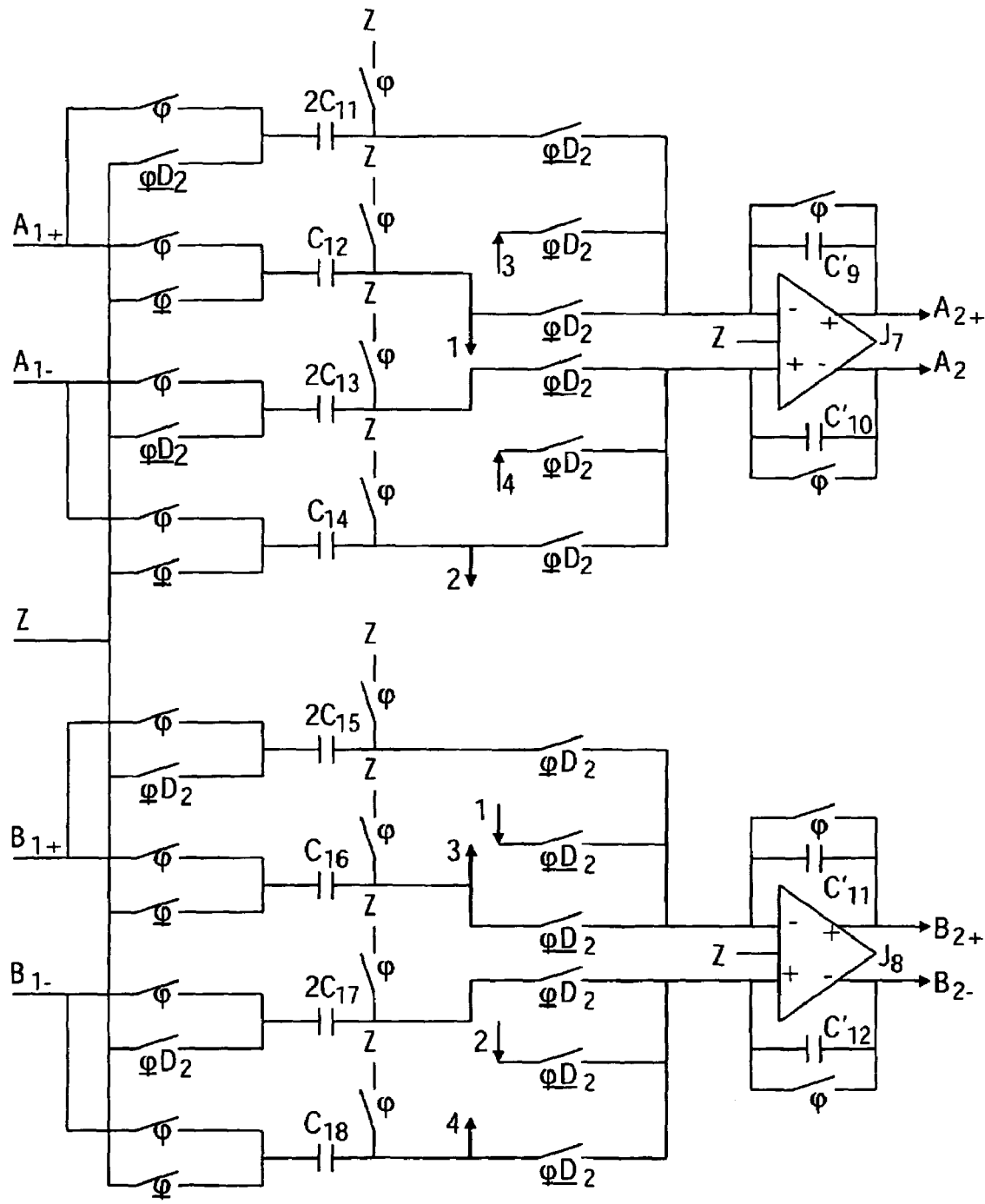
Figure 8:
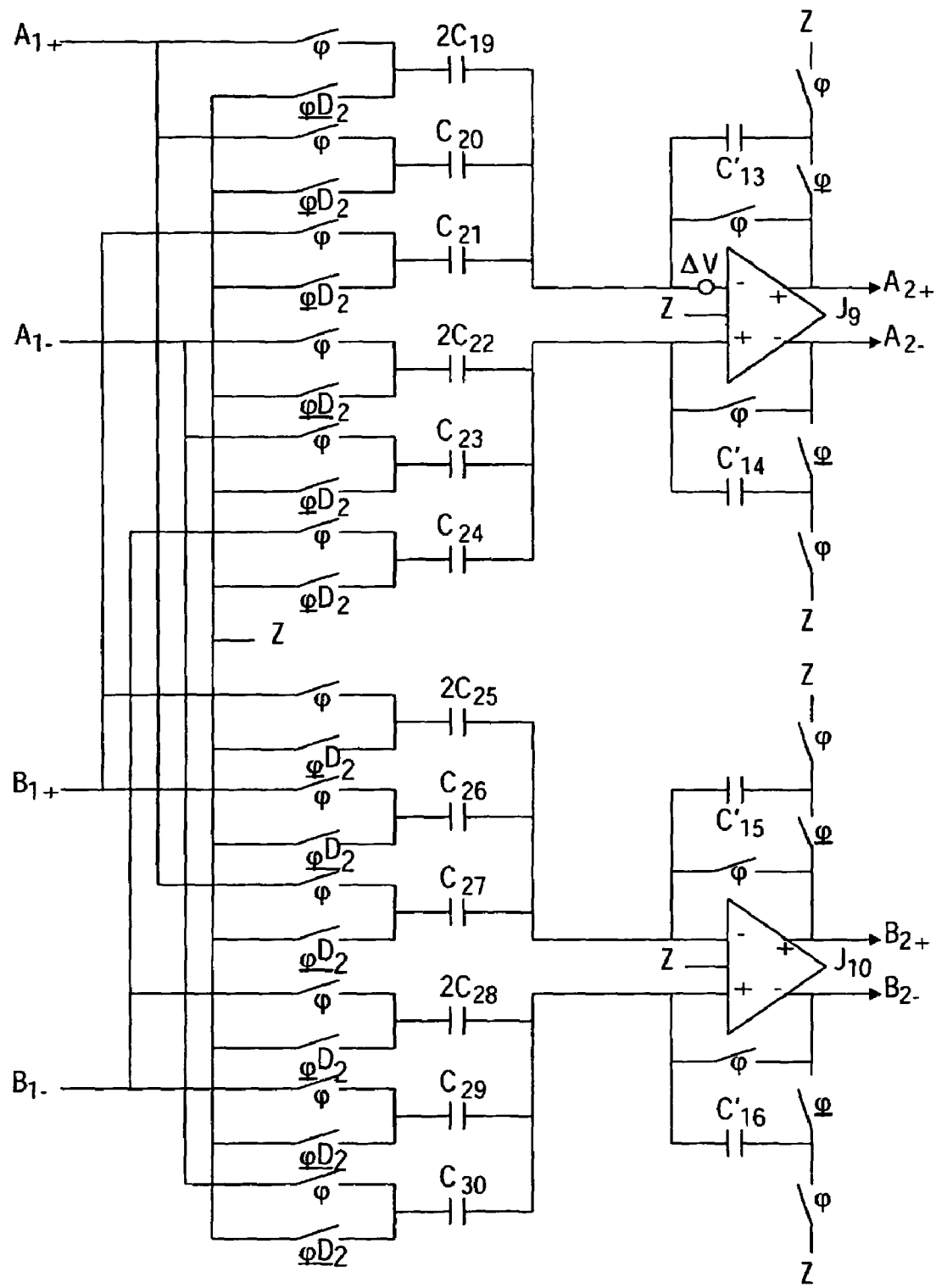
Figure 9:
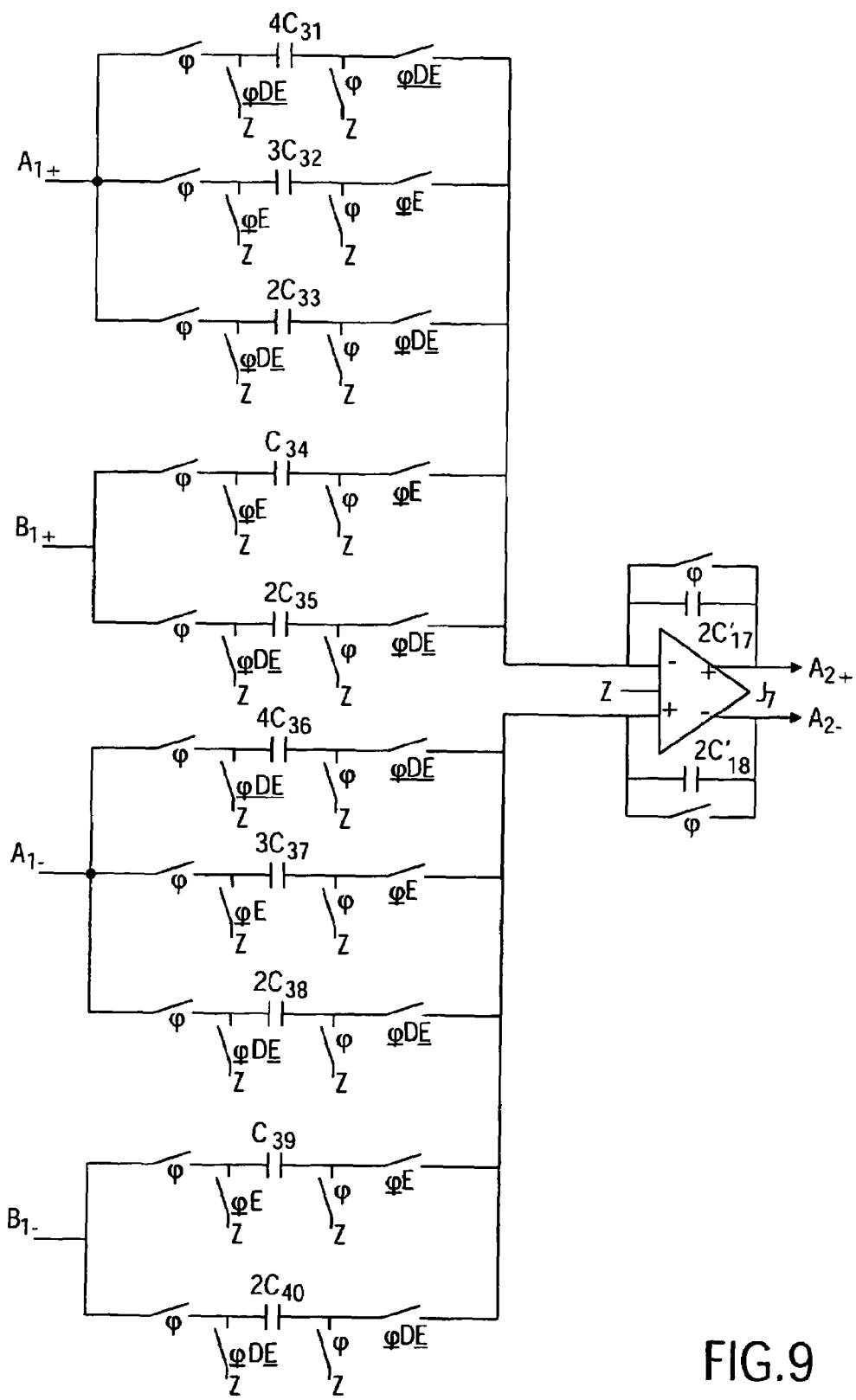
Figure 10:
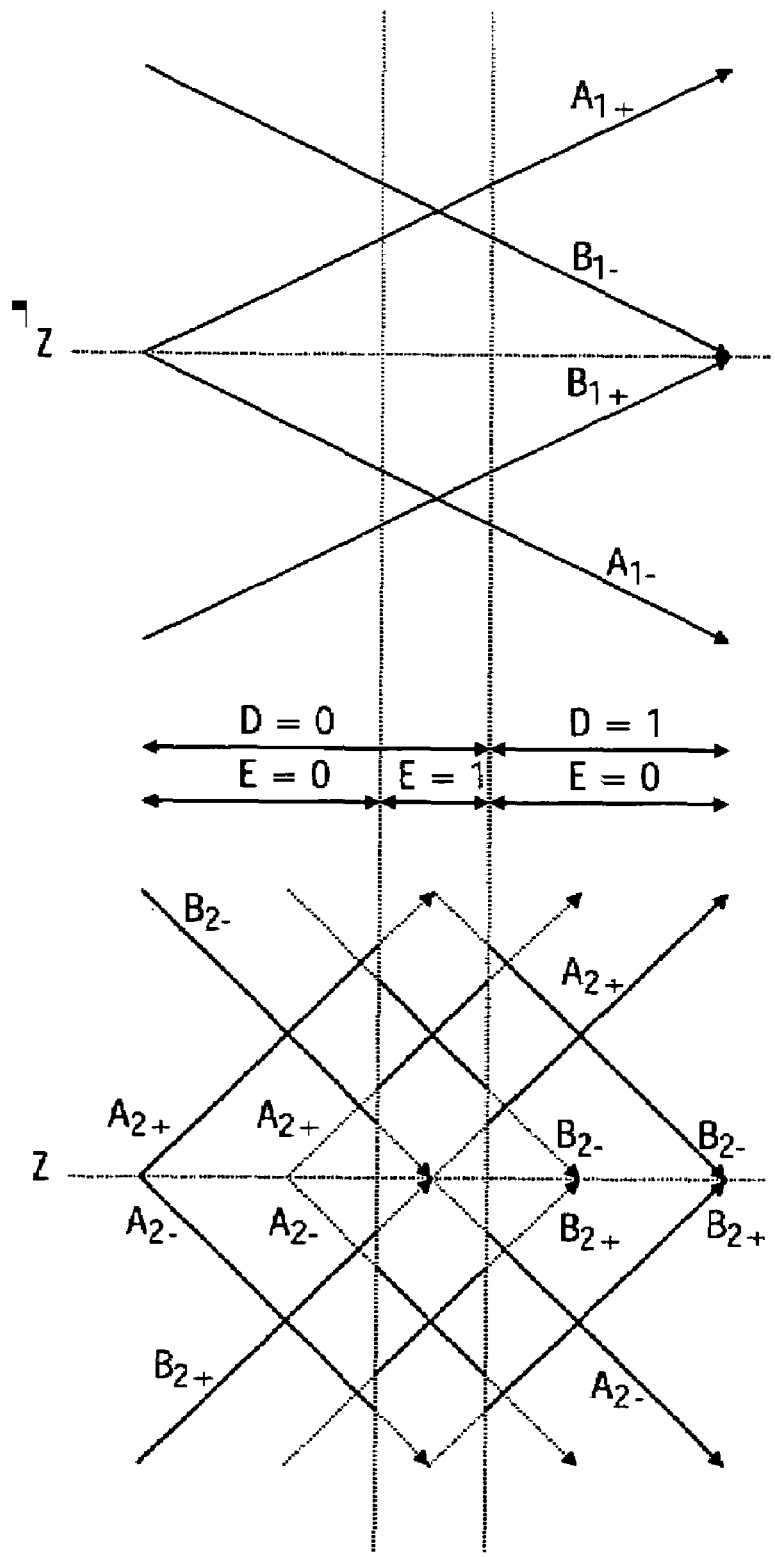

The invention will be described with reference to the accompanying figures. Herein shows:

FIG. 1 a block diagram of an unbalanced dual residue pipeline converter,

FIG. 2 a schematic diagram of an embodiment of a dual residue generator for use in the first stage of a converter as shown in FIG. 1, FIG. 3 a schematic diagram of an embodiment of a dual residue generator for use in an intermediary stage of a converter as shown in FIG. 1, FIG. 4 arrow-graphs for explaining the operation of the unbalanced AD converter of FIG. 1 and the balanced AD converter of FIG. 5, FIG. 5 a block diagram of a balanced dual residue pipeline converter, FIG. 6 a schematic diagram of an embodiment of a balanced dual residue generator for use in the first stage of a converter as shown in FIG. 5, FIG. 7 a schematic diagram of a first embodiment of a balanced dual residue generator for use in an intermediary stage of a converter as shown in FIG. 5, FIG. 8 a schematic diagram of a second embodiment of a balanced dual residue generator for use in an intermediary stage of a converter as shown in FIG. 5, FIG. 9 a schematic diagram of part of a third embodiment of a balanced dual residue generator for use in an intermediary stage of a converter as shown in FIG. 5 and FIG. 10 arrow graphs for explaining the operation of the residue generator of FIG. 9.

The pipelined AD converter of FIG. 1 comprises a cascade of converter stages $S_1 \ldots S_N$ each of which delivers one bit (k=1) of the digital output word. The first stage $S_1$ delivers the most significant bit $D_1$, the second stage $S_2$ delivers the second most significant bit $D_2$ etcetera, while the last stage $S_N$ delivers the least significant bit $D_N$.

The stage $S_1$ receives the analog input signal I as well as the voltages $R_1$ and $R_2$, which represent the extreme values between which the input signal may vary. A voltage divider of equal resistors $V_1$ and $W_1$ derives the mean voltage Z of these extreme values ($Z=(R_1+R_2)/2$) and this voltage Z is also transferred as a reference voltage to the next stages. The stage $S_1$ further comprises a comparator $G_1$ in which the input signal I is compared with the reference voltage Z and which delivers the bit $D_1$. This bit is 1 when the input signal I is above Z i.e. in the upper half of the voltage range between $R_1$ and $R_2$ and the bit $D_1$ is 0 when the input signal is below Z i.e. in the lower half of this voltage range. Finally the stage $S_1$ contains a residue generator $H_1$, which receives the input signal I, the bit $D_1$ and the reference voltages $R_1$, $R_2$, Z and which produces two residue signals $A_1$ and $B_1$. The construction and the operation of this residue generator will be explained hereafter with reference to FIG. 2.

The two residue signals $A_1$ and $B_1$ are applied to the second stage $S_2$. A voltage divider of equal resistors $V_2$ and $W_2$ derives the mean value $(A_1+B_1)/2$ of the two residue signals and this mean value is compared with the reference voltage Z in a comparator $G_2$. This comparator produces the second bit $D_2$ which is 0 when the mean value $(A_1+B_1)/2$ of the residue signal is below the reference Z and which is 1 when this mean value is above the reference voltage Z. A residue generator $H_2$ receives the two residue signals $A_1$ and $B_1$ and the Z reference and it produces the next residue signals $A_2$ and $B_2$. The construction and operation of the residue generator $H_2$ will be explained with reference to FIG. 3.

The further stages $S_3 \ldots S_{N-1}$, except the last one, are identical in construction and operation with the stage $S_2$ and each of said further stages produces a further bit of the digital output word and the residue signals for the next stage.

The dual residue generator of FIG. 2 comprises an operational amplifier $J_1$ with an output capacitor $C'_1$ in feedback arrangement between the output and the inverting input of the operational amplifier and the reference voltage Z connected to the non-inverting input thereof. An input capacitor $C_1$ receives through switches the input voltage I and the reference voltages $R_1$ and Z. The switches do not bear reference numerals but are indicated by their switch-phases. The switches indicated by $\phi$ are closed during a sampling phase of a clock cycle and open during a tracking phase of the clock cycle. The switches indicated by $\underline{\phi}$ are closed during the tracking phase and open during the sampling phase. The switches indicated by $\underline{\phi}D_1$ are closed during the tracking phase but only when the bit $D_1$ is "zero" and the switches indicated by $\phi D_1$ are closed during the tracking phase but only when the bit $D_1$ is "one". Thus it may be seen from FIG. 1 that during the sampling phase $\phi$ the input capacitor $C_1$ is loaded to the voltage I–Z and that the output capacitor $C'_1$ is emptied during this phase. During the tracking phase $\underline{\phi}$ and if the bit $D_1$ is "zero", the left hand plate of the input capacitor is connected to the voltage $R_1$ while the right hand plate of this capacitor is connected to the inverting input of the operational amplifier $J_1$. This inverting input is kept at the voltage Z by the feedback operation of this amplifier. Consequently, the charge of the input capacitor, which was $(I-Z).C$ at the end of the sampling phase, becomes $(R_1-Z)C$ during the tracking phase. The difference $(I-R_1).C$ is transferred to the output capacitance, so that the voltage across this capacitor becomes $(I-R_1).C/C'$ and the voltage at the $A_1$-output of the operational amplifier $J_1$ becomes $A_1=Z+(I-R_1).C/C'$. Herein C is the capacitance of the input capacitor $C_1$ and of the other input capacitors. C' is the capacitance of the output capacitor $C'_1$ and of the other output capacitors. If the bit $D_1$ is "one", a similar operation applies except in that during the tracking phase, instead of the voltage $R_1$, the voltage Z is applied to the left plate of the input capacitor $C_1$. The result is that the residue signal $A_1$ now becomes: $A_1=Z+(I-Z).C/C'$.

The dual residue generator $H_1$ further comprises a second branch with a second operational amplifier $J_2$, a second output capacitor $C'_2$ and a second input capacitor $C_2$ for the generation of the residue signal $B_1$. This second branch is identical to the first branch except in that, instead of the voltages $R_1$ and Z, now the voltages Z and $R_2$ are applied to the input capacitor $C_2$ during the tracking phase and when the bit $D_1$ is "zero" and "one" respectively. The result is that for the second residue signal $B_1$ the following expressions hold:

$$B_1=Z+(I-Z).C/C' \text{ if } D_1=0$$

$$B_1=Z+(I-R_2).C/C' \text{ if } D_1=1$$

Figure 4A:
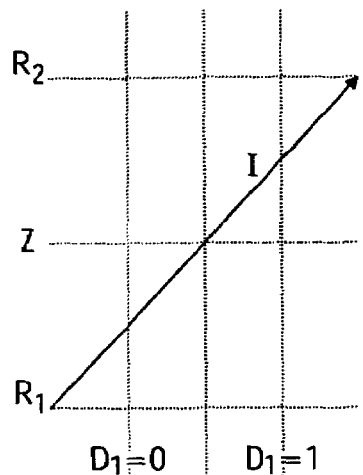
Figure 4B:
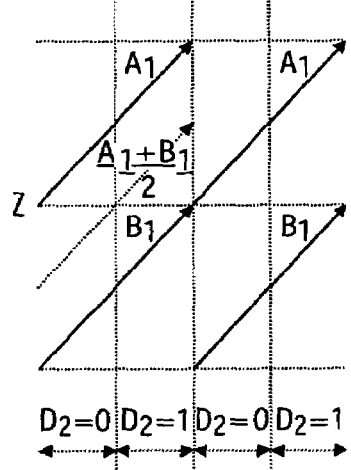

With the four above given equations the input signal I and the two residue signals $A_1$ and $B_1$ are depicted in the arrow-graphs of FIGS. 4a and 4b. These figures show that the two residue signals are identical for input signal values in the lower half of its range $R_1<I<Z$ and for input signal values in the upper half of its range $Z<I<R_2$. This is essential for a pipelined converter stage.

The residue generator $H_2$ in the second stage $S_2$ of the pipelined converter of FIG. 1 has to calculate the two residue signals $A_2$ and $B_2$ from the signals $A_1$ and $B_1$ delivered by the first stage. This generator, illustrated in FIG. 3, has two branches, each with an operational amplifier $J_3$, $J_4$, an output capacitor $C'_3$, $C'_4$ in feedback arrangement, input capacitors $C_3$-$C_4$, $C_5$-$C_6$ and accompanying switches. Unlike the branches of FIG. 2, the two branches of FIG. 3 have each two input capacitors. The branch for the generation of the first residue signal $A_2$ has the two input capacitors $C_3$ and $C_4$ and the branch for the generation of the residue signal $B_2$ has the input capacitors $C_5$ and $C_6$. The input capacitor $C_3$ receives the residue signal $A_1$ of the first stage during the sampling phase. The input capacitor $C_4$ receives the residue signal $A_1$ during the sampling phase if the bit $D_2$ is "zero" and receives the second residue signal $B_1$ during the sampling phase if the bit $D_2$ is "one". During the tracking phase and when the bit D2 is "zero" each of the two input capacitors $C_3$ and $C_4$ transfers the charge $(A_1-Z).C$ to the output capacitor $C'_3$ with the result that the output residue $A_2=Z+2.(A_1-Z).C/C'$. On the other hand, when the bit $D_2$ is "one", the input capacitor $C_3$ transfers during the tracking phase the charge $(A_1-Z).C$ to the output capacitor $C'_3$ and the input capacitor $C_4$ transfers the charge $(B_1-Z).C$ to this output capacitor $C_3$ with the result that the output residue $A_2=Z+(A_1-Z).C/C'+(B_1-Z).C/C'$.

The second branch of the dual residue generator of FIG. 3 serves for the generation of the residue $B_2$. This branch contains an operational amplifier $J_4$ with output capacitor $C'_4$ in feedback arrangement, input capacitors $C_5$ and $C_6$ and accompanying switches. The branch is identical with the $A_2$-branch except in that now the input capacitor $C_5$ receives during the sampling mode the residue signal $B_1$ instead of the residue signal $A1$. The result is that when the bit $D_2$ is "zero" the output residue $B_2=Z+(A_1-Z).C/C'+(B_1-Z).C/C'$ and when bit $D_2$ is "one" this output residue $B_2=Z+2.(B_1-Z).C/C'$.

Figure 4C:
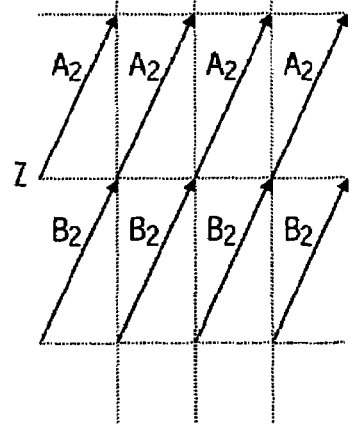
Figure 4D:
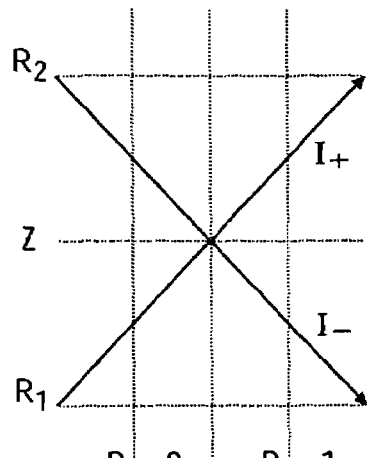

With the four equations for the residues $A_2$ and $B_2$ the arrows of these residues with increasing input signal can be drawn. This is shown in FIG. 4c. Again it may be seen that each of the two generated residue signals $A_2$ and $B_2$ for the upper part of the input residues $A_1$ and $B_1$ when $D_2=1$ is identical with the same signal for the lower part of the input residues when $D_2=0$.

The dual residue generators $H_3 \ldots H_{N-1}$ of the converter stages $S_3 \ldots S_{N-1}$ are all identical with the dual residue generator $H_2$ explained above. Of course only the input residue references and the output residue references have to be increased accordingly.

From the graphs of FIGS. 4b and 4c it is apparent that the dual residue signals $A_2$ and $B_2$ are amplified by a factor 2 with respect to the dual residue signals $A_1$ and $B_1$. This is done to make optimum use of the dynamic range of the converter stages. The amplification is achieved by the fact that in the dual residue generator of FIG. 3 the charge of two input capacitors is transferred to one single output capacitor. It is hereby assumed that the capacitance value C' of each output capacitor is approximately equal to the value C of each input capacitor. It is noted that the gain of the dual residue generator of the first stage $S_1$ is (approximately) 1, because here the dynamic range of the single input signal has to be used by two output residues.

In practice it is not possible to make the capacitance values of the input and output capacitors accurately equal to each other. This is because the parasitic capacitances of the operational amplifier and of the switches have different influence on the input capacitance C and on the output capacitance C'. Therefore the "amplification factor" C/C' that appear in the above given equations, will in practice not have the exact desired value. In contrast to the single residue converter, the dual residue converter is insensitive to these inaccuracies of the amplification factor, because the decisions made by the comparators $G_1 \ldots G_N$ are not influenced by the inaccurate amplification factor C/C'. This may be exemplified by the arrow-diagram of FIG. 4b. The decision criterion for the generation of the second bit $D_2$ lies at $(A_1+B_1)/2=Z$. With other words: at one side of this point the bit $D_2=0$ and at the other side this bit $D_2=1$. When the ratio C/C' increases or decreases then the slope of the arrows $A_1$ and $B_1$ in FIG. 4b increases or decreases. Also the slope of the dashed arrow $(A_1+B_1)/2$ just between the arrows $A_1$ and $B_1$ increases or decreases but the intersection of this arrow with the level Z remains unchanged, and consequently the decision made by the comparator $G_2$ remains correct. The value of the ratio C/C' of a converter stage may be inaccurate and even the ratio C/C' of one stage may be different from the ratio C/C' of the other stages in the cascade. What remains of importance is that the values C of the input capacitances in one stage are sufficiently equal to each other and also that the values C' of the output capacitances in one stage are sufficiently equal to each other. This is not a big problem in monolithic integration processes, because in integrated circuit technology elements with corresponding functions may easily be given a corresponding structure with substantially equal values.

The balanced dual residue pipelined AD converter of FIG. 5 comprises N cascaded stages $T_1 \ldots T_N$ of which the first one receives a balanced input signal $I_+$, $I_-$ and which contains a dual residue signal generator $M_1$ for generating two balanced residue signals $A_{1+}$, $A_{1-}$ and $B_{1+}$, $B_{1-}$. These two balanced residue signals are applied to the second stage $T_2$ which comprises a dual residue signal generator $M_2$ for generating two balanced residue signals $A_{2+}$, $A_{2-}$ and $B_{2+}$, $B_{2-}$ and so on. Each of the stages $T_1 \ldots T_N$ has a comparator $K_1 \ldots K_N$ for deriving one digital bit $D_1 \ldots D_N$. In the balanced converter the bits can be simply obtained by comparing received signals with each other, so that the voltage dividers $V_2$, $W_2 \ldots V_N$, $W_N$ of FIG. 1 can be dispensed with. The comparator $K_1$ compares the input signals $I_+$ and $I_-$ with each other and produces a first bit $D_1$ which is "zero" when $I_+<I_-$ and which is "one" when $I_+>I_-$. The comparator $K_2$ compares the residue signals $A_{1+}$ and $B_{1-}$ with each other and produces a second bit $D_2$ which is "zero" when $A_{1+}<B_{1-}$ and which is "one" when $A_{1+}>B_{1-}$ and so on. Only the first stage $T_1$ contains a voltage divider of equal resistors $L_1$ and $L_2$ for deriving a reference level Z, which is used in all stages $T_1 \ldots T_{N-1}$. When in the converter stage $S_2$ the residue signals $A_{1+}$, $A_{1-}$ and $B_{1+}$, $B_{1-}$ have different common mode offsets $\Delta A \neq \Delta B$, the decision point of the bit $D_2$ is at $A_{1+}+\Delta A=B_{1-}+\Delta B$ i.e. at $A_{1+}-B_{1-}=\Delta B-\Delta A \neq 0$. This error may be avoided by applying the four residue signals $A_{1+}$, $A_{1-}$, $B_{1+}$ and $B_{1-}$ to the comparator $K_2$ and to have the decision point of the bit $D_2$ at $A_{1+}-A_{1-}=B_{1-}-B_{1+}$. Then the common mode offsets in $A_{1+}$ and $A_{1-}$ cancel against each other and also the offsets in $B_{1+}$ and $B_{1-}$. Of course a corresponding measure can be taken in any of the other comparators $K_3 \ldots K_N$.

FIG. 6 shows the contents of the first balanced residue generator $M_1$ of the AD converter of FIG. 5. The generator contains two branches, one for the generation of the balanced residue signals $A_{1+}$, $A_{1-}$ and one for the generation of the balanced residue signals $B_{1+}$, $B_{1-}$. The first branch comprises a balanced operational amplifier $J_5$ with one output for the $A_{1+}$ residue signal, one output for the $A_{1-}$ residue signal and two inputs. Two output capacitors $C'_5$ and $C'_6$ are connected in feedback arrangement between each output and the respective inverting input of the operational amplifier. Input capacitors $C_7$ and $C_8$ are arranged for being coupled to the said inputs of the operational amplifier during the tracking phase $\bar{\phi}$. Switches are present to charge during the sampling phase $\phi$ of the clock pulse cycle the input capacitors $C_7$ and $C_8$ from applied input signals $I_+$ and $I_-$ respectively and to transfer the charge during the tracking phase $\bar{\phi}$ to the output capacitors $C'_5$ and $C'_6$ respectively. In FIG. 6 the switches bear no reference numerals but they are provided with indications about their opening and closing phases, just the same as has been done in the FIGS. 2 and 3.

The second branch of the generator of FIG. 6, with a balanced operational amplifier $J_6$, output capacitors $C'_7$ and $C'_8$, input capacitors $C_9$ and $C_{10}$ and associated switches, is equal in construction to the first branch but operates with different input voltages. The balanced dual residue generator of FIG. 6 generates the two balanced residue signals $A_{1+}$, $A_{1-}$ and $B_{1+}$, $B_{1-}$ according to the following equations:

| If $D_1 = 0$ ($I_+ < I_-$) | If $D_1 = 1$ ($I_+ > I_-$) |
|---|---|
| $A_{I+} = Z + (I_+ - R_1) \cdot C/C''$ | $A_{I+} = Z + (I_+ - Z) \cdot C/C''$ |
| $A_{I-} = Z + (I_- - R_2) \cdot C/C''$ | $A_{I-} = Z + (I_- - Z) \cdot C/C''$ |
| $B_{I+} = Z + (I_+ - Z) \cdot C/C''$ | $B_{I+} = Z + (I_+ - R_2) \cdot C/C'$ |
| $B_{I-} = Z + (I_- - Z) \cdot C/C''$ | $B_{I-} = Z + (I_- - R_1) \cdot C/C''$ |

FIG. 7 shows an exemplary schematic diagram of the balanced dual residue generator $M_2$ of the converter of FIG. 5. Two balanced operational amplifiers $J_7$ and $J_8$ and four output capacitors $C'_9$, $C'_{10}$, $C'_{11}$ and $C'_{12}$ connected thereto in feedback arrangement have an operation similar to those described with reference to FIG. 6. The arrangement comprises eight input capacitors $2C_{11}$, $C_{12}$, $2C_{13}$, $C_{14}$, $2C_{15}$, $C_{16}$, $2C_{17}$ and $C_{18}$. The capacitors $C_{12}$, $C_{14}$, $C_{16}$ and $C_{18}$ ideally have equal values C and the capacitors $2C_{11}$, $2C_{13}$, $2C_{15}$ and $2C_{17}$ ideally have the double value 2C. The charging of the input capacitors during the sampling phase of the clock cycle and the charge transfer from the input capacitors to the output capacitors during the tracking phase of the clock cycle is performed through switches of which the opening and closing phases are indicated in the same way as in the FIGS. 2, 3 and 6.

In operation: during the sampling phase the output capacitor $C'_9$ is emptied and the input capacitor $2C_{11}$ is loaded with a charge $(A_{1+}-Z).2C$. During the tracking phase and when the bit $D_2=0$ this charge is transferred to the output capacitor $C'_9$ so that the voltage across this capacitor will be equal to $(A_{1+}-Z).2C/C'$ and the output signal $A_{2+}$ will be equal to $A_{2+}=Z+(A_{1+}-Z).2C/C'$. When $D_2=1$ the charge of the input capacitor $2C_{11}$ remains unused. During the sampling phase is the input capacitor $C_{12}$ charged with $(A_{1+}-Z).C$. During the tracking phase and when $D_2=0$ this charge is transferred to the output capacitor $C'_{11}$ through the connection indicated by the arrows I, and when $D_2=1$ this charge is transferred to the output capacitor $C'_9$. Simultaneously, when $D_2=1$, the output capacitor $C'_9$ receives, through the connection indicated by the arrows 3, a charge $(B_{1+}-Z).C$ from input capacitor $C_{16}$. The result is that, when $D_2=1$, the output residue $A_{2+}=Z+(A_{1+}-Z).C/C'+(B_{1+}-Z).C/C'$. The other elements of the residue generator of FIG. 7 operate in a similar manner, so that the total result of this generator may be expressed by the following equations:

$$D_2 = 0$$
$$A_{2+} = Z + (A_{1+} - Z)\frac{2C}{C'}$$
$$A_{2-} = Z + (A_{1-} - Z)\frac{2C}{C'}$$
$$B_{2+} = Z + (B_{1+} - Z)\frac{C}{C'} + (A_{1+} - Z)\frac{C}{C'}$$
$$B_{2-} = Z + (B_{1-} - Z)\frac{C}{C'} + (A_{1-} - Z)\frac{C}{C'}$$

$$D_2 = 1$$
$$A_{2+} = Z + (A_{1+} - Z)\frac{C}{C'} + (B_{1+} - Z)\frac{C}{C'}$$
$$A_{2-} = Z + (A_{1-} - Z)\frac{C}{C'} + (B_{1-} - Z)\frac{C}{C'}$$
$$B_{2+} = Z + (B_{1+} - Z)\frac{2C}{C'}$$
$$B_{2-} = Z + (B_{1-} - Z)\frac{2C}{C'}$$

Figure 4E:
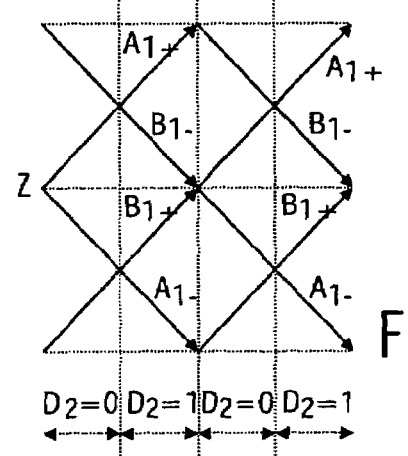
Figure 4F:
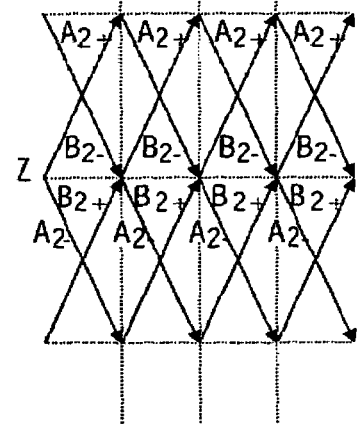

These relations between the input residue signals and the output residue signals of the second stage are illustrated with the arrow-graphs of FIGS. 4e and 4f. It is seen that the generated residue signals for $D_2=1$ are identical to the generated residue signals for $D_2=0$. This characteristic repeats itself in the further converter stages. It is further noted that the crossing of the $A_{2+}$ arrow and the $B_{2-}$ arrow, which determines the signal level where the bit $D_3$ will change its value, lies exactly in the middle of the ranges $D_2=0$ and $D_2=1$ and that this crossing remains in place when the slope of the residue signals $A_{2+}$ and $B_{2-}$ alters. This means that the bit-generation is independent on the gain of the stage i.e. on the ratio of the input capacitances and the output capacitances of the stage. On the other hand the slopes of the two arrows have to be as much as possible equal to each other, which means that the input capacitances of the stage have to be as equal as possible to each other and the same holds for the output capacitances of the stage.

In the residue generator of FIG. 3 the bit D2 controls switches ($\phi D_2$, $\phi \overline{D_2}$) that are closed in the sampling phase. This implies that the decision of the comparator G2 has to be made prior to the sampling phase of the stage G2 i.e. the stage has to have three clock phases: a comparison phase, a sampling phase and a tracking phase. In contradistinction the arrangement of FIG. 7 has, at the cost of more input capacitance, only D2-controlled switches ($\phi D_2$, $\phi \overline{D_2}$) that are closed during the tracking phase. This means that the comparator-decision can be made in the sampling phase and the result is an AD-converter with a higher conversion rate.

The arrangement of FIG. 8 comprises balanced operational amplifiers $J_9$ and $J_{10}$ for the generation of the first and second residue output signals $A_{2+}$, $A_{2-}$ and $B_{2+}$, $B_{2-}$ respectively. Four output capacitors $C'_{13}$, $C'_{14}$, $C'_{15}$ and $C'_{16}$ are provided, each of which is connected through a switch that is closed during the tracking phase $\overline{\phi}$ in feedback arrangement between an amplifier output terminal and the corresponding inverting amplifier input. Further switches are provided that directly connect each amplifier output to the corresponding inverting amplifier input and that discharges the output capacitor to the reference voltage Z during the sampling phase $\phi$.

Each of the input terminals of the operational amplifiers $J_9$ and $J_{10}$ is connected to one side of three input capacitors whose other sides receive input residue signals during the sampling phase $\phi$. For example, the upper input terminal of the amplifier $J_9$ is connected to a first input capacitor $2C_{19}$ that receives the input residue signal $A_{1+}$ during the sampling phase, to a second input capacitor $C_{20}$ that also receives the input residue signal $A_{1+}$ during this phase and to a third input capacitor $C_{21}$ that receives the input residue signal $B_{1+}$ during this phase. Said other sides of the input capacitors receive the reference voltage Z during the tracking phase $\overline{\phi}$, the capacitor $2C_{19}$ when the bit $D_2=0$ and the capacitors $C_{20}$ and $C_{21}$ when $D_2=1$. In similar way three input capacitors $2C_{22}$, $C_{23}$ and $C_{24}$ are arranged to feed the lower input terminal of $J_9$, three input capacitors $2C_{25}$, $C_{26}$ and $C_{27}$ feed the upper terminal of amplifier $J_{10}$ and three input capacitors $2C_{28}$, $C_{29}$ and $C_{30}$ feed the lower input terminal of $J_{10}$. The reference of the capacitors $2C_{19}$, $2C_{22}$, $2C_{25}$ and $2C_{28}$ indicate that these capacitors have double capacitance value 2C with respect to the other input capacitors that have the value C.

In FIG. 8 the DC-offset appearing at the upper input terminal of the amplifier $J_9$ is indicated by an offset source with value $\Delta V$. Although this offset is shown outside the opamp, it will be apparent that the offset is intrinsic to the opamp and that therefore the left hand terminal of the offset voltage source is the actual input terminal of the amplifier.

When comparing the arrangement of FIG. 8 with that of FIG. 7, it may be seen that during the sampling phase the right hand side of the input capacitors is not connected to the reference voltage Z, as is the case in FIG. 7, but to the virtual reference of the input terminal of the opamp. Because of the offset $\Delta V$ at this terminal this virtual reference has the value $Z+\Delta V$. Moreover, the output capacitor $C'_{13}$, in stead of being completely discharged during the sampling phase, is now connected between the virtual reference voltage $Z+\Delta\Delta V$ at one side and the reference voltage at the other side, so that the output capacitor is "loaded" by the offset voltage $-\Delta V$.

In operation, during the sampling phase $\phi$ the input capacitor $2C_{19}$ is connected between the input residue signal $A_{1+}$ and the virtual reference $Z+\Delta V$, so that the charge of this capacitor is $\{A_{1+}-(Z+\Delta V)\}.2C$. During the tracking phase and when $D_2=0$, this capacitor is connected between Z and $Z+\Delta V$ so that its charge is $\{Z-(Z+\Delta V)\}.2C$. The difference there between, i.e. the charge $(A_{1+}-Z).2C$ is transferred to the output capacitor $C'_{13}$ during the tracking phase. This output capacitor, which is loaded during the sampling phase with the charge $-\Delta V.C'$, receives the charge $(A_{1+}-Z).2C$ from the input capacitor so that the resulting charge is $(A_{1+}-Z).2C-\Delta V.C'$. This charge results in a voltage $(A_{1+}-Z).2C/C'-\Delta V$ across the output capacitor C' and because the left hand side of $C'_{13}$ remains connected to the virtual reference $Z+\Delta V$, the output voltage $A_{2+}$ at the right hand side of this capacitor is equal to $A_{2+}=Z+(A_{1+}-Z).2C/C'$. The offset voltage $\Delta V$ is completely cancelled in the output signal and the expression for this output residue is the same as in the arrangement of FIG. 7. This result is achieved because, in the arrangement of FIG. 8, the input capacitance is connected to the offset disturbed input of the operational amplifier both during the sampling phase and during the tracking phase, so that the charge transferred from the input capacitor to the output capacitor is free of offset. Moreover, during the sampling phase the output capacitor is charged by the offset voltage so that the offset applied to the output terminal through the output capacitor is cancelled by the offset across this capacitor.

It may be noted that in FIG. 8 only the offset voltage of the upper input terminal of the opamp $J_9$ is shown. Also the other opamp input-terminals have offsets, which usually are different in value from each other. Each of these offsets is cancelled in a similar arrangement of switched input and output capacitors as described above with reference to the capacitors $2C_{19}$ and $C'_{13}$. It is further observed that in the arrangement of FIG. 7 each of the input capacitors $C_{12}$, $C_{14}$, $C_{16}$ and $C_{18}$ serves the generation of two residue output signals. E.g. the input capacitor $C_{12}$ serves the generation of the output residues $A_{2+}$ and $B_{2+}$. In the arrangement of FIG. 8 a similar dual use of input capacitors would result in that the offset of one opamp input terminal has to cancel the offset of another opamp input terminal. Because the offsets are usually unequal such dual use of input capacitors cannot be applied in the arrangement of FIG. 8.

FIG. 9 shows a balanced residue generator for use in a so-called 1.5 bit converter stage. A residue generator for a 1.5 bit pipeline architecture is per se known from the article "A 10 b, 20 Msample/s, 35 mW Pipeline A/D Converter" from T. B. Cho and P. R. Gray in IEEE Journal of Solid State Circuits, Vol. 30, No 3 March 1995 pp. 166-172. The residue generator of FIG. 9 is supposed to operate with a comparator that provides two bits D and E that are 0.0 in a first input range, 1.0 in a second input range and 0.1 in a third input range lying symmetrically between the first and second input ranges. The generator of FIG. 9 comprises an output circuit for the balanced residue signal $A_{2+}$, $A_{2-}$ with an operational amplifier $J_{11}$ and two output capacitors $2C'_{17}$ and $2C'_{18}$, that is identical in operation with the output circuits of the arrangement of FIG. 7. The arrangement has three input capacitors $4C_{31}$, $3C_{32}$ and $2C_{33}$ for the storage of the input residue signal $A_{1+}$, two input capacitors $C_{34}$, and $2C_{35}$ for the storage of the input residue signal $B_{1+}$, three input capacitors $4C_{36}$, $3C_{37}$ and $2C_{38}$ for the storage of the input residue signal $A_{1-}$ and two input capacitors $C_{39}$ and $2C_{40}$ for the storage of the input residue signal $B_{1-}$. As in FIG. 7 the leading ciphers of these references indicate the capacitance value of these capacitors. The capacitance of $4C_{31}$ and $4C_{36}$ is equal to 4C, the value of $3C_{32}$ and $3C_{37}$ is equal to 3C, the value of $2C_{33}$, $2C_{35}$, $2C_{38}$, and $2C_{40}$ is 2C and the value of $C_{34}$ and $C_{39}$ is equal to C. Switches indicated with $\phi$ that are closed during the sampling mode and open during the tracking mode, serve for the charge of the input capacitors with the signals $A_{1+}-Z$, $B_{1+}-Z$, $A_{1-}-Z$ and $B_{1-}-Z$ and the discharge of the output capacitors during the sampling mode $\phi$. Switches indicated with $\underline{\phi}$ that are open during the sampling mode and may be closed during the tracking mode serve for the transfer of the charge of the input capacitors to the output capacitors during the tracking mode.

The switches $\underline{\phi}$ that serve the transfer of charge from input capacitors to output capacitors, have references D, E, $\underline{D}$ and $\underline{E}$ indicating the range mode that they are closed during the tracking phase. The switches with reference $\underline{\phi DE}$ are closed during the tracking phase when D=0 and E=0, in which case charge transfer takes place from the input capacitors $4C_{31}$ and $4C_{36}$ to the output capacitors $2C'_{17}$ and $2C'_{18}$ respectively. Equal switches $3C_{32}$, $C_{34}$, $3C_{37}$ and $C_{39}$ referenced by $\underline{\phi}E$ are closed during the tracking phase when E=1 and the switches $2C_{33}$, $2C_{35}$, $2C_{38}$ and $2C_{40}$ referenced by $\underline{\phi D\underline{E}}$ are closed during the tracking phase when D=1 and E=0.

The part of the residue generator for the second balanced output residue signals $B_{2+}$, $B_{2-}$ is not shown in FIG. 9 but is identical to the part depicted in this figure with the exceptions that the indications A and B should be interchanged and that the references D and $\underline{D}$ should be interchanged. The equations resulting from the charge transfers in this arrangement are:

for $D = 0$ and $E = 0$ $$A_{2+} = Z + (A_{1+} - Z)\frac{4C}{2C'}$$

$$A_{2-} = Z + (A_{1-} - Z)\frac{4C}{2C'}$$

$$B_{2+} = Z + (B_{1+} - Z)\frac{2C}{2C'} + (A_{1+} - Z)\frac{2C}{2C'}$$

$$B_{2-} = Z + (B_{1-} - Z)\frac{2C}{2C'} + (A_{1-} - Z)\frac{2C}{2C'}$$

for $E = 1$ $$A_{2+} = Z + (A_{1+} - Z)\frac{3C}{2C'} + (B_{1+} - Z)\frac{C}{2C'}$$

$$A_{2-} = Z + (A_{1-} - Z)\frac{3C}{2C'} + (B_{1-} - Z)\frac{C}{2C'}$$

$$B_{2+} = Z + (B_{1+} - Z)\frac{3C}{2C'} + (A_{1+} - Z)\frac{C}{2C'}$$

$$B_{2-} = Z + (B_{1-} - Z)\frac{3C}{2C'} + (A_{1-} - Z)\frac{C}{2C'}$$

for $D = 1$ and $E = 0$ $$A_{2+} = Z + (A_{1+} - Z)\frac{2C}{2C'} + (B_{1+} - Z)\frac{2C}{2C'}$$

$$A_{2-} = Z + (A_{1-} - Z)\frac{2C}{2C'} + (B_{1-} - Z)\frac{2C}{2C'}$$

$$B_{2+} = Z + (B_{1+} - Z)\frac{4C}{2C'}$$

$$B_{2-} = Z + (B_{1-} - Z)\frac{4C}{2C'}$$

The operation of the 1.5 bit architecture of FIG. 9 is illustrated in the arrow-graph of FIG. 10. The introduction of the input capacitors $3C_{32}$, $C_{34}$, $3C_{37}$ and $C_{39}$ has created a third range (E=1) between the original first and second ranges as shown in FIG. 7.

When the critical decision point determined in the comparator $K_2$ of FIG. 5, i.e. the point where $A_{1+}=B_{1-}$, is corrupted, for instance by DC-offset of the comparator, then without the range E=1 not only the generated bit but also the generated residue signals for the subsequent stages in the cascade will be corrupted. The introduction of the third range (E=1) replaces the said critical decision point by two non-critical decision points namely the two borders of the third range. The arrangement described above with reference to FIG. 9 generates in this range non-corrupted balanced residue output signals. In a digital processor (not shown) the E-bit of the stage and the bits generated by the subsequent stages are used to calculate a new bit that replaces the not generated D-bit.

The converter stages described in the figures to this application are all intended to produce one bit per stage. The invention also covers stages that produce more than one bit per stage. For instance, it is quite feasible to have the first stage in the converter to produce two bits while the other stages are all single-bit. In a two-bit first stage a voltage divider for at least three reference voltages is required and the switches of the switched capacitor residue generator have to be controlled by both the generated bits. The advantage of such configuration is that more gain can be realized in the first stage, which improves the noise behavior of the converter.

The invention claimed is:

1. A dual residue pipelined AD-converter for converting an analog input signal to a digital output signal, said converter comprising
    a cascade of dual residue converter stages,
    at least two stages in the cascade of dual residue converter stages each including
        switched capacitor means to receive two residue signals generated by a previous stage in the cascade, one of the residue signals representing quantization error relative to a first quantization level and the other one of the residue signals representing quantization error relative to a second quantization level,
        means to derive one or more digital bits from said received residue signals, and
        means to generate a respective first residue signal representing quantization error relative to a first quantization level and a respective second residue signal representing quantization error relative to a second quantization level, the first and second residue signals representing the quantization error resulting from an AD-conversion.

2. A dual residue pipelined AD-converter as claimed in claim 1 characterized in that the at least two stages each include input capacitors for receiving during a sampling phase the two residue signals generated by the previous stage, switching means to transfer during a tracking phase the charge of said input capacitors to first and second output capacitors, and means to generate the respective first and second residue signals from said first and second output capacitors respectively.

3. A dual residue pipelined AD-converter as claimed in claim 2 characterized in that said switching means are arranged to transfer charge from one of the received residue signals to said first output capacitor with a gain factor of approximately 2 and charge from both said received residue signals to said second output capacitor each with a gain factor of approximately 1 in a first sub-range mode and to transfer charge from the other one of the received residue signals to said second output capacitor with a gain factor of approximately 2 and charge from both said received residue signals to said first output capacitor each with a gain factor of approximately 1 in a second sub-range mode.

4. A dual residue pipelined AD-converter as claimed in claim 3 characterized in that said switching means are additionally arranged to transfer charge from both said received residue signals to said first output capacitor with a gain factor of approximately 3/2 and 1/2 respectively and charge from both said received residue signals to said second output capacitor with a gain factor of approximately 1/2 and 3/2 respectively in a third sub-range mode which lies symmetrically between said first and second sub-range modes.

5. A dual residue pipelined AD-converter as claimed in claim 2 characterized in that for the generation of each residue signal an operational amplifier is provided and that each output capacitor is connected during the tracking phase between an output terminal and the inverting input terminal of said operational amplifier.

6. A dual residue pipelined AD-converter as claimed in claim 5 characterized in that one side of each input capacitor is connected to said inverting input terminal both during the sampling phase and during the tracking phase and that each output capacitor is charged during the sampling phase by the offset voltage at the inverting input of the operational amplifier.

7. A dual residue pipelined AD-converter as claimed in claim 1, characterized in that the two residue signals are are balanced signals and the respective first and second residue signals are balanced signals.

8. A dual residue pipelined AD-converter for converting an analog input signal to a digital output signal, said converter comprising a cascade of dual residue converter stages,
    the first of said stages including means to receive the analog input signal, means to derive one or more digital bits from said analog input signal and means to generate first and second residue signals representing the quantization error left after the AD-conversion of said first stage, and
    each of the following stages in the cascade of dual residue converter stages including means to receive respective first and second residue signals generated by the previous stage in the cascade, means to derive one or more further digital bits from said received first and second residue signals and each of said following stages except the last one in the cascade include input capacitors for receiving during a sampling phase the first and second residue signals generated by the previous stage, switching mean to transfer during a tracking phase the charge of said input capacitors to first and second output capacitors, and means to generate first and second residue signals representing the quantization error left after the AD-conversion of the stage from said first and second output capacitors respectively,
    characterized in that said switching means are arranged to transfer charge from said first received residue signal to said first output capacitor with a gain factor of approximately 2 and charge from both said first and second received residue signals to said second output capacitor each with a gain factor of approximately 1 in a first sub-range mode and to transfer charge from said second received residue signal to said second output capacitor with a gain factor of approximately 2 and charge from both said first and second received residue signals to said first output capacitor each with a gain factor of approximately 1 in a second sub-range mode.

9. A dual residue pipelined AD-converter as claimed in claim 8 characterized in that for the generation of each residue signal an operational amplifier is provided and that each output capacitor is connected during the tracking phase between an output terminal and the inverting input terminal of said operational amplifier.

10. A dual residue pipelined AD-converter as claimed in claim 9 characterized in that one side of each input capacitor is connected to said inverting input terminal both during the sampling phase and during the tracking phase and that each output capacitor is charged during the sampling phase by the offset voltage at the inverting input of the operational amplifier.

11. A dual residue pipelined AD-converter as claimed in claim 8, characterized in that each of said following stages except the last one in the cascade are arranged to receive balanced first and second residue signals from the previous stage and to generate therefrom balanced first and second residue signals for application to the next stage in the cascade.

12. A dual residue pipelined AD-converter for converting an analog input signal to a digital output signal, said converter comprising a cascade of dual residue converter stages,
   the first of said stages including means to receive the analog input signal, means to derive one or more digital bits from said analog input signal and means to generate first and second residue signals representing the quantization error left after the AD-conversion of said first stage, and
   each of the following stages in the cascade of dual residue converter stages including means to receive the first and second residue signals generated by the previous stage in the cascade, means to derive one or more further digital bits from said received first and second residue signals and each of said following stages except the last one in the cascade include input capacitors for receiving during a sampling phase the first and second residue signals generated by the previous stage, switching mean to transfer during a tracking phase the charge of said input capacitors to first and second output capacitors, and means to generate first and second residue signals representing the quantization error left after the AD-conversion of the stage from said first and second output capacitors respectively,
   characterized in that for the generation of each residue signal an operational amplifier is provided and that one side of each input capacitor is connected to the inverting input terminal of the operational amplifier both during the sampling phase and during the tracking phase and that each output capacitor is charged during the sampling phase by the offset voltage at the inverting input of the operational amplifier.

13. A dual residue pipelined AD-converter as claimed in claim 12 characterized in that each output capacitor is connected during the tracking phase between an output terminal and the inverting input terminal of said operational amplifier.

14. A dual residue pipelined AD-converter as claimed in claim 12, characterized in that each of said following stages except the last one in the cascade are arranged to receive balanced first and second residue signals from the previous stage and to generate therefrom balanced first and second residue signals for application to the next stage in the cascade.

* * * * *